(12) United States Patent
Chatterjee et al.

(10) Patent No.: US 8,401,469 B2
(45) Date of Patent: Mar. 19, 2013

(54) SHIELD FOR USE WITH A COMPUTING DEVICE THAT RECEIVES AN INDUCTIVE SIGNAL TRANSMISSION

(75) Inventors: Manjirnath Chatterjee, San Francisco, CA (US); Mark Corbridge, Weymouth Dorest (GB); Michael Lehr, Sunnyvale, CA (US); Wim Crooijmans, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 941 days.

(21) Appl. No.: 12/455,802

(22) Filed: Jun. 4, 2009

(65) Prior Publication Data

US 2010/0081483 A1  Apr. 1, 2010

Related U.S. Application Data

(63) Continuation-in-part of application No. 12/239,656, filed on Sep. 26, 2008.

(60) Provisional application No. 61/142,195, filed on Jan. 1, 2009.

(51) Int. Cl.
*H04B 5/00* (2006.01)
*H04B 1/10* (2006.01)

(52) U.S. Cl. ..................... 455/41.1; 455/300

(58) Field of Classification Search ............... 455/575.5, 455/106, 300, 301, 573, 41.1, 41.2, 292, 455/90.3
See application file for complete search history.

(56) References Cited

U.S. PATENT DOCUMENTS

| | | |
|---|---|---|
| 5,375,226 A | 12/1994 | Sano et al. |
| 5,455,466 A | 10/1995 | Parks et al. |
| 5,596,567 A | 1/1997 | de Muro et al. |
| 5,600,225 A | 2/1997 | Goto |
| 5,666,530 A | 9/1997 | Clark et al. |
| 5,733,313 A | 3/1998 | Barreras et al. |
| 5,760,580 A | 6/1998 | Tyren |
| 5,831,348 A | 11/1998 | Nishizawa |
| 5,958,051 A | 9/1999 | Renaud et al. |
| 6,006,274 A | 12/1999 | Hawkins et al. |
| 6,091,965 A * | 7/2000 | Voroba et al. .................. 455/570 |
| 6,138,245 A | 10/2000 | Son et al. |
| 6,184,651 B1 | 2/2001 | Fernandez et al. |
| 6,266,539 B1 | 7/2001 | Pardo |
| 6,330,436 B1 | 12/2001 | Zidel |
| 6,389,423 B1 | 5/2002 | Sakakura |
| 6,405,049 B2 | 6/2002 | Herrod et al. |
| 6,436,299 B1 | 8/2002 | Baarman et al. |
| 6,445,936 B1 | 9/2002 | Cannon et al. |
| 6,501,364 B1 | 12/2002 | Hui et al. |

(Continued)

FOREIGN PATENT DOCUMENTS

| | | |
|---|---|---|
| CN | 1592197 A | 3/2005 |
| EP | 395469 A2 | 10/1990 |

(Continued)

OTHER PUBLICATIONS

U.S. Appl. No. 11/430,786, filed May 8, 2006, Baraban et al.

(Continued)

*Primary Examiner* — Eugene Yun

(57) ABSTRACT

Embodiments described herein include a computing device that is capable of inductive signal transfer with other computing devices. Such computing devices are provided a shield that protects the device and other components from electromagnetic interference and unwanted electrical affects resulting from the inductive signal transfer.

24 Claims, 12 Drawing Sheets

U.S. PATENT DOCUMENTS

| | | |
|---|---|---|
| 6,510,424 B1 | 1/2003 | Ford et al. |
| 6,532,152 B1 | 3/2003 | White et al. |
| 6,671,700 B1 | 12/2003 | Creemer et al. |
| 6,673,250 B2 | 1/2004 | Kuennen et al. |
| 6,731,071 B2 | 5/2004 | Baarman |
| 6,795,110 B1 | 9/2004 | Kossin |
| 6,803,744 B1 | 10/2004 | Sabo |
| 6,806,649 B2 | 10/2004 | Mollema et al. |
| 6,810,405 B1 | 10/2004 | LaRue et al. |
| 6,812,645 B2 | 11/2004 | Baarman |
| 6,825,620 B2 | 11/2004 | Kuennen et al. |
| 6,831,417 B2 | 12/2004 | Baarman |
| 6,850,986 B1 | 2/2005 | Peacock |
| 6,888,438 B2 | 5/2005 | Hui et al. |
| 6,917,163 B2 | 7/2005 | Baarman |
| 6,975,198 B2 | 12/2005 | Baarman et al. |
| 6,986,051 B2 | 1/2006 | Le Pennec et al. |
| 7,065,658 B1 | 6/2006 | Baraban et al. |
| 7,116,200 B2 | 10/2006 | Baarman et al. |
| 7,118,240 B2 | 10/2006 | Baarman et al. |
| 7,126,450 B2 | 10/2006 | Baarman et al. |
| 7,132,918 B2 | 11/2006 | Baarman et al. |
| 7,149,473 B1 | 12/2006 | Lindlar et al. |
| 7,164,255 B2 | 1/2007 | Hui |
| 7,248,017 B2 | 7/2007 | Cheng et al. |
| 7,262,700 B2 | 8/2007 | Hsu |
| 7,271,569 B2 | 9/2007 | Oglesbee |
| 7,286,880 B2 | 10/2007 | Olson et al. |
| 7,331,793 B2 | 2/2008 | Hernandez et al. |
| 7,375,492 B2 | 5/2008 | Calhoon et al. |
| 7,382,636 B2 | 6/2008 | Baarman et al. |
| 7,385,357 B2 | 6/2008 | Kuennen et al. |
| 7,392,059 B2 | 6/2008 | White et al. |
| 7,414,380 B2 | 8/2008 | Tang et al. |
| 7,446,672 B2 | 11/2008 | Johnson et al. |
| 7,454,170 B2 | 11/2008 | Goossens et al. |
| 7,462,951 B1 | 12/2008 | Baarman |
| 7,471,986 B2 | 12/2008 | Hatlestad |
| 7,495,414 B2 | 2/2009 | Hui |
| 7,509,432 B1 | 3/2009 | Peacock |
| 7,521,890 B2 | 4/2009 | Lee et al. |
| 7,576,514 B2 | 8/2009 | Hui |
| 7,589,285 B2 * | 9/2009 | Matsumoto et al. .......... 174/381 |
| 7,743,151 B2 | 6/2010 | Vallapureddy et al. |
| 2002/0084698 A1 | 7/2002 | Kelly et al. |
| 2002/0103008 A1 | 8/2002 | Rahn et al. |
| 2003/0214255 A1 | 11/2003 | Baarman et al. |
| 2003/0233455 A1 | 12/2003 | Leber et al. |
| 2004/0088012 A1 | 5/2004 | Kroll et al. |
| 2004/0130915 A1 | 7/2004 | Baarman |
| 2004/0130916 A1 | 7/2004 | Baarman |
| 2004/0150934 A1 | 8/2004 | Baarman |
| 2004/0222751 A1 | 11/2004 | Mollema et al. |
| 2004/0232845 A1 | 11/2004 | Baarman et al. |
| 2004/0259499 A1 | 12/2004 | Oba et al. |
| 2005/0007067 A1 | 1/2005 | Baarman et al. |
| 2005/0093475 A1 | 5/2005 | Kuennen et al. |
| 2005/0116650 A1 | 6/2005 | Baarman |
| 2005/0122058 A1 | 6/2005 | Baarman et al. |
| 2005/0122059 A1 | 6/2005 | Baarman et al. |
| 2005/0127849 A1 | 6/2005 | Baarman et al. |
| 2005/0127850 A1 | 6/2005 | Baarman et al. |
| 2006/0041420 A1 | 2/2006 | Martin et al. |
| 2006/0061958 A1 | 3/2006 | Solomon et al. |
| 2006/0123055 A1 | 6/2006 | Atkinson et al. |
| 2006/0132045 A1 | 6/2006 | Baarman |
| 2007/0035917 A1 | 2/2007 | Hotelling et al. |
| 2007/0064406 A1 | 3/2007 | Beart |
| 2007/0120752 A1 | 5/2007 | Takasu |
| 2007/0182367 A1 | 8/2007 | Partovi |
| 2007/0188284 A1 | 8/2007 | Dobbs |
| 2007/0246546 A1 | 10/2007 | Yoshida |
| 2007/0290654 A1 | 12/2007 | Govari et al. |
| 2008/0133918 A1 | 6/2008 | You et al. |
| 2008/0196086 A1 | 8/2008 | Shintani et al. |
| 2008/0231537 A1 | 9/2008 | Rofougaran et al. |
| 2008/0278894 A1 | 11/2008 | Chen et al. |
| 2009/0001932 A1 | 1/2009 | Kamijo et al. |
| 2009/0001941 A1 | 1/2009 | Hsu et al. |
| 2009/0008148 A1 | 1/2009 | Mashino |
| 2009/0069869 A1 | 3/2009 | Stouffer et al. |
| 2009/0088077 A1 | 4/2009 | Brown et al. |
| 2009/0106567 A1 | 4/2009 | Baarman |
| 2009/0170433 A1 | 7/2009 | Rhodes et al. |
| 2009/0212637 A1 | 8/2009 | Baarman et al. |
| 2009/0212737 A1 | 8/2009 | Johnson et al. |
| 2010/0007449 A1 | 1/2010 | Tait et al. |
| 2010/0021176 A1 | 1/2010 | Holcombe et al. |
| 2010/0045269 A1 | 2/2010 | LaFranchise et al. |
| 2010/0070219 A1 | 3/2010 | Azancot et al. |
| 2010/0076524 A1 | 3/2010 | Forsberg et al. |
| 2010/0081377 A1 | 4/2010 | Corbridge et al. |
| 2010/0081473 A1 | 4/2010 | Chatterjee et al. |
| 2010/0083012 A1 | 4/2010 | Corbridge et al. |
| 2010/0121965 A1 | 5/2010 | Chatterjee |
| 2010/0131691 A1 | 5/2010 | Chatterjee et al. |
| 2010/0146308 A1 | 6/2010 | Gioscia et al. |
| 2010/0156193 A1 | 6/2010 | Rhodes et al. |
| 2010/0172090 A1 | 7/2010 | Chatterjee |
| 2010/0177476 A1 | 7/2010 | Hotelling et al. |
| 2010/0194336 A1 | 8/2010 | Azancot et al. |

FOREIGN PATENT DOCUMENTS

| | | |
|---|---|---|
| FR | 2601161 A1 | 1/1988 |
| GB | 2389720 B | 9/2005 |
| GB | 2399466 B | 11/2005 |
| GB | 2389767 B | 4/2006 |
| JP | 09-259241 A | 10/1997 |
| JP | 11-354348 A | 12/1999 |
| JP | 3161388 B2 | 2/2001 |
| KR | 10-0836634 B1 | 6/2008 |
| WO | WO 95/03686 A1 | 2/1995 |
| WO | WO 2004/098079 A1 | 11/2004 |
| WO | WO 2005/024865 A2 | 3/2005 |
| WO | WO 2008/033670 A2 | 3/2008 |
| WO | WO 2008/044875 A1 | 4/2008 |
| WO | WO 2008/133806 A1 | 11/2008 |
| WO | WO 2009/057771 A1 | 5/2009 |
| WO | WO 2010/005324 A1 | 1/2010 |
| WO | WO 2010/062198 A1 | 6/2010 |
| WO | WO 2010/068062 A2 | 6/2010 |
| WO | WO 2010/068062 A3 | 7/2010 |
| WO | WO 2010/091269 A1 | 8/2010 |

OTHER PUBLICATIONS

U.S. Appl. No. 29/323,688, filed Aug. 28, 2008, Matsuoka.
Final Office Action mailed Jul. 9, 2007 in U.S. Appl. No. 11/430,786.
Final Office Action mailed Jul. 19, 2010 in U.S. Appl. No. 11/430,786.
Final Office Action mailed Oct. 25, 2004 in U.S. Appl. No. 09/861,658, 10 pgs.
Final Office Action mailed Dec. 30, 2009 in U.S. Appl. No. 11/430,786.
Final Office Action mailed Jan. 8, 2009 in U.S. Appl. No. 11/430,786.
Hui et al., "A New Generation of Universal Contactless Battery Charging Platform for Portable Consumer Electronic Equipment," IEEE Trans Power Electronics, 20(3):620-627 (2005).
International Search Report and Writen Opinion dated Aug. 31, 2010 in International Application No. PCT/US2010/020054.
Kean, Steven, "Powermat Portable Wireless Charging Mat", pp. 1-12 dwnloaded from http://www.bigbruin.com/content/powermat_1 on Sep. 29, 2010.
Liang et al., "An implantable bi-directional wireless transmission system for transcutaneous biological signal recording," Physiol. Meas. 26:83-97 (2005).
Mel B. W. et al., "Tablet: Personal Computer in the Year 2000", Communications of the Association for Computing machinery, New Your, NY vol. 31, No. 6, Jun. 1, 1988, 639-646 XP000047633ISSN: 0001-0782.
Non-Final Office Action mailed Mar. 24, 2010 in U.S. Appl. No. 11/430,786.
Non-Final Office Action mailed Jun. 11, 2009 in U.S. Appl. No. 11/430,786.

Non-Final Office Action mailed Jan. 25, 2008 in U.S. Appl. No. 11/430,786.
Non-Final Office Action mailed Sep. 30, 2010 in U.S. Appl. No. 11/430,786, 7 pgs.
Non-Final Office Action mailed Oct. 5, 2006 in U.S. Appl. No. 11/430,786.
Non-Final Office Action mailed Apr. 22, 2004 in U.S. Appl. No. 09/861,658, 7 pgs.
Non-Final Office Action mailed Apr. 7, 2005 in U.S. Appl. No. 09/861,658, 11 pgs.
Non-Final Office Action mailed Jul. 25, 2008 in U.S. Appl. No. 11/430,786.
Notice of Allowance mailed Jan. 9, 2006 in U.S. Appl. No. 09/861,658, 12 pgs.
Opticon Users manual DWT 7133, Nov. 2000.
U.S. Appl. No. 12/916,388, filed Oct. 29, 2010, Chatterjee et al.
U.S. Appl. No. 12/975,335, filed Dec. 21, 2010, Oh et al.
U.S. Appl. No. 12/987,940, filed Jan. 10, 2011, Chatterjee et al.
Non-Final Office Action mailed Nov. 3, 2010 in U.S. Appl. No. 12/478,616, 12 pgs.
U.S. Appl. No. 12/628,401, filed Dec. 1, 2009, Chatterjee.
U.S. Appl. No. 12/840,241, filed Jul. 20, 2010, Chatterjee.
U.S. Appl. No. 12/841,001, filed Jul. 21, 2010, Chatterjee.
U.S. Appl. No. 29/323,686, filed Aug. 28, 2008, Matsuoka et al.
International Search Report and WRitten Opinion dated Aug. 20, 2010 in International Application No. PCT/US2009/069847.
International Search Report and Written Opinion dated Jul. 28, 2010 in International Application No. PCT/US2009/068332.
International Search Report and Written Opinion dated Jul. 21, 2010 in International Application No. PCT/US2009/068328.
International Search Report and Written Opinion dated Apr. 20, 2010 in International Application No. PCT/US2009/055928.

* cited by examiner

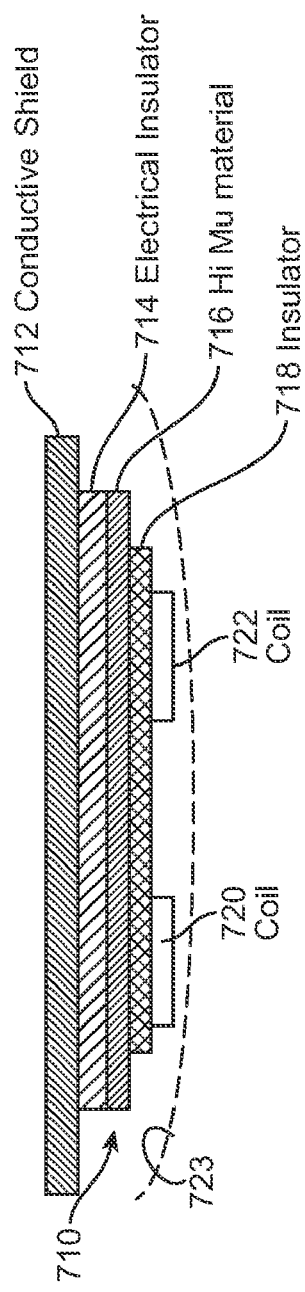
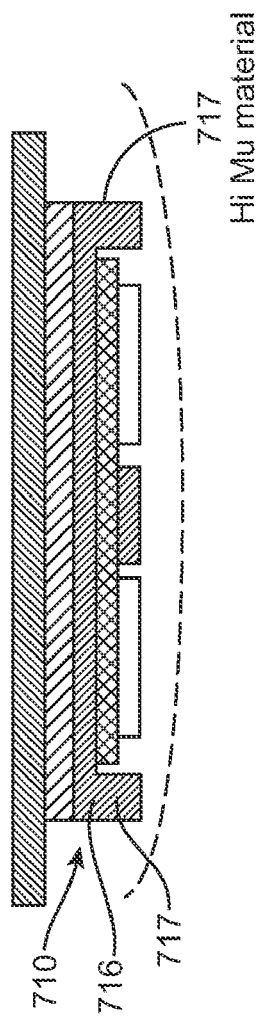

SHIELD FOR USE WITH A COMPUTING DEVICE THAT RECEIVES AN INDUCTIVE SIGNAL TRANSMISSION

RELATED APPLICATIONS

This application claims benefit of priority to U.S. Provisional Application No. 61/142,195, filed Jan. 1, 2009, entitled TECHNIQUES FOR MAGNETICALLY COUPLING CHARGING CIRCUITS AND DEVICES; the aforementioned priority application being hereby incorporated by reference in its entirety.

This application is a continuation-in-part of U.S. patent application Ser. No. 12/239,656, filed Sep. 26, 2008, entitled ORIENTATION AND PRESENCE DETECTION FOR USE IN CONFIGURING OPERATIONS OF COMPUTING DEVICES IN DOCKED ENVIRONMENTS; the aforementioned application being hereby incorporated by reference in its entirety.

TECHNICAL FIELD

The disclosed embodiments relate to mobile computing devices that are enabled to receive inductive signals. In particular, the disclosed embodiments relate to a shield for use with a computing device that receives an inductive signal transmission.

BACKGROUND

It is well established in magnetic induction that a changing magnetic flux density in the presence of an electrical conductor can be exploited to cause an electric current. Static magnets, such as bar magnets, do not induce such electrical currents, as such magnets do not have magnetic fields that are time-varying. A common implementation of induced current in time-varying magnetic fields is a transformer. In typical transformer design, an alternating (AC or time changing) electric current in one winding will induce a time changing magnetic field in the iron core. This in turn induces a different current in the output winding.

BRIEF DESCRIPTION OF THE DRAWINGS

FIG. 7A and FIG. 7B illustrate a variation to other embodiments described herein.

DETAILED DESCRIPTION

Figure 1:
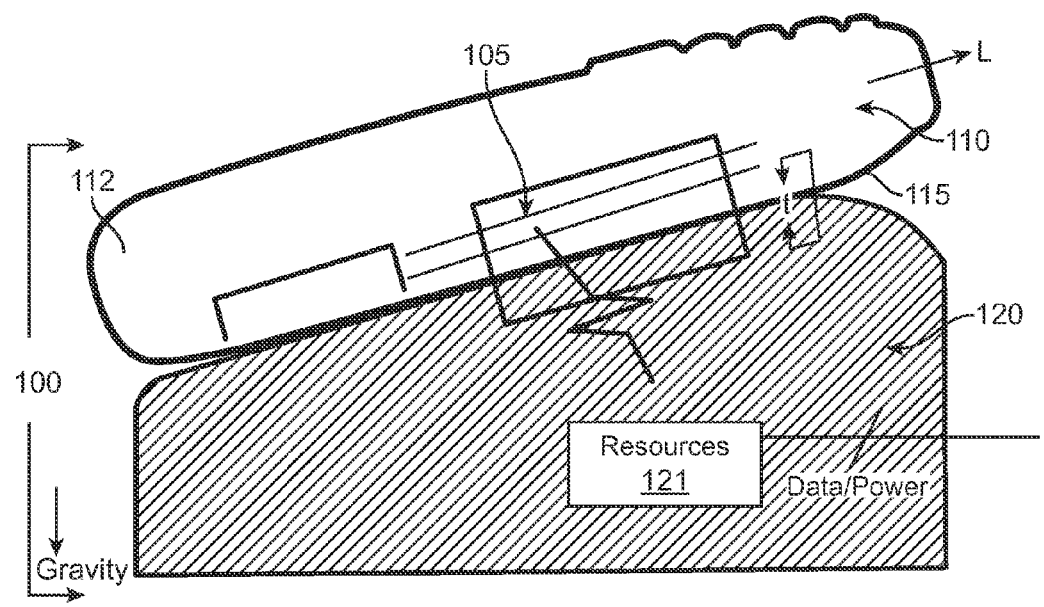
FIG. 1 is a representative diagram illustrating two computing devices that can be brought into contact for purpose of enabling one device to provide a power and/or data signal to the other device, according to an embodiment of the invention.

Embodiments described herein include a computing device that is capable of receiving or transmitting inductive signals to a compatible device. The computing device includes an inductive shield that protects external devices and/or components of the device from magnetically induced unwanted electrical effects.

Embodiments described herein provide an inductive shield for use in protecting a computing device that is inductively coupled to another computing device. In particular, embodiments described herein provide an inductive shield to protect circuit or electronic elements of a device, receiving an inductively transmitted signal from another device, from the magnetic field of the device that inductively transmits the signal.

As used herein, a materials is considered to have of high magnetic permeability if its permeability is several hundred times (e.g. 300) that of air. As described herein, such materials may be used as low magnetic reluctance flux path guides, provided such materials have low electrical conductivity. As an alternative, candidate flux path materials which have high permeability, but also exhibit high electrical conductivity may be used as low reluctance magnetic flux path guides, provided that efforts are made to limit induced eddy currents. In particular, such high conductive/high permeability materials may be structurally configured to act as relatively low reluctance magnetic flux guides through, for example, the formation of slots or holes in the material, reducing the thickness of the material, or through use of multilayer lamination techniques.

Numerous embodiments described herein apply between any two devices that are inductively coupled and which carry circuit or electronic elements. In some embodiments, the two devices correspond to a mobile computing device and a docking station (or dock). However, other configurations and devices may be configured in accordance with embodiments described herein.

Some embodiments described herein may generally require the use of computers, including processing and memory resources. For example, systems described herein may be implemented on a server or network service. Such servers may connect and be used by users over networks such as the Internet, or by a combination of networks, such as cellular networks and the Internet. Alternatively, one or more embodiments described herein may be implemented locally, in whole or in part, on computing machines such as desktops, cellular phones, personal digital assistances or laptop computers. Thus, memory, processing and network resources may all be used in connection with the establishment, use or performance of any embodiment described herein (including with the performance of any method or with the implementation of any system).

Furthermore, some embodiments described herein may be implemented through the use of instructions that are executable by one or more processors. These instructions may be carried on a computer-readable medium. Machines shown in figures below provide examples of processing resources and computer-readable mediums on which instructions for implementing embodiments of the invention can be carried and/or executed. In particular, the numerous machines shown with embodiments of the invention include processor(s) and various forms of memory for holding data and instructions. Examples of computer-readable mediums include permanent memory storage devices, such as hard drives on personal computers or servers. Other examples of computer storage mediums include portable storage units, such as CD or DVD units, flash memory (such as carried on many cell phones and personal digital assistants (PDAs)), and magnetic memory. Computers, terminals, network enabled devices (e.g. mobile devices such as cell phones) are all examples of machines and devices that utilize processors, memory, and instructions stored on computer-readable mediums.

Overview

FIG. 1 is a representative diagram illustrating two computing devices that can be brought into contact for purpose of enabling one device to provide a power and/or data signal to the other device, according to an embodiment of the invention. Numerous embodiments described herein, including an embodiment such as described with FIG. 1, reference a mobile computing device ("MCD") and docking station ("dock") as two devices that are brought into contact with one another for purpose of power/data transfer without use of traditional insertive or mechanically coupled connectors. However, different kinds of devices (e.g. portable devices and accessory devices) may be used with embodiments described herein. In the examples provided for the numerous embodiments described, the two devices may correspond to, for example, a MCD and an accessory device for the MCD. In one implementation, the MCD is a multi-purpose device having cellular data and telephonic capabilities, while the accessory device corresponds to, for example, a docking station (for communications and power supply), sticky (or piggy)-back accessory, a light projector, a speaker set, or headset station. As an addition or alternative to cellular telephony/data capabilities, the MCD may include, for example, functionality for use as a media player, a camera or video recorder, a global positioning unit, an ultramobile personal computer, a laptop computer, or a multi-purpose computing device. Numerous other examples and implementations are described herein, including embodiments in which three or more devices are interconnected through one or more connector-less connections.

Accordingly, a system 100 includes a MCD 110 that is supported or otherwise retained by a dock 120. The manner in which the MCD 110 is supported may vary. Moreover, as described with one or more embodiments, the orientation of the MCD on the dock may be changed by the user for purpose of configuring operations or behavior of one or both devices. According to an orientation of an embodiment shown, the MCD 110 is supported on the dock 120 in a partially upright position along its length axis (L). Such an orientation may correspond to a 'portrait' position. In an embodiment in which alternative orientations are possible, the 'landscape' positions, or positions in between the portrait and landscape positions may be possible.

According to an embodiment, the dock 120 utilizes physical support structures (not shown), such as shelves, platforms, hooks or mechanical retention features, to retain the MCD 110 in a docked or mated position. In another embodiment, magnetic clasps may be included or provided the dock 120 and/or the MCD 110 to secure retention of the MCD against the dock.

The MCD 110 and dock 120 of system 100 are inductively enabled to enable one or both devices to inductively transmit power or data to the other device. Each device may include inductive resources to enable transmission and/or receipt of inductive signals. In particular, MCD includes a component set 105 to receive inductive signals from the dock 120. Likewise, the dock 120 may include resources 121 for inductively transmitting power and/or data signals to the MCD 110. For example, the dock 120 may be mated with a power outlet or another computer (e.g. desktop computer) to extend power and/or data signals. The resources 121 may include circuitry or hardware, such as AC/DC converters and regulators. In order to enable the dock 120 to receive electrical power from a personal computer or other computing station, one implementation provides for the dock 120 to include a physical connector port, such as provided by a Universal Serial Bus (USB) connector. Additionally, the dock 120 may include data acquisition capabilities, provided through connector ports with the computer, wireless ports (e.g. cellular, WiMax connection, Bluetooth), Internet ports, and media feeds (e.g. provided through television tuner and cable).

As shown by an embodiment of FIG. 1, the MCD 110 has a housing shell 112 having a thickness (t). The housing shell 112 may be used to retain internal components of the MCD 110, such as a circuit board, processor, memory, or components of a display assembly. The component set 105 may carry components, such as described below, to enable the device to (i) receive inductive transmissions from the dock 120; and/or (ii) transmit inductive signal (power or data). In one embodiment, the component set 105 includes one or coils, a processor, and circuitry elements for converting electrical signals into magnetic fields and vice-versa.

As described with numerous embodiments, the component set 105 of the MCD 110 includes an inductive shield 115 that protects the other elements of the MCD from the magnetic field generated by the dock 120 in making the inductive signal. In particular, a magnetic field generated from the dock 120 may cause eddy or side currents in the electrical elements of the MCD. To address such cross-electrical currents, one or more embodiments provide for use of the inductive shield 115 to preclude or inhibit the magnetic field of the MCD 110 from reaching or affecting other components of the MCD 110 (including components that are not used for inductively signaling with the dock 120).

Figure 2:
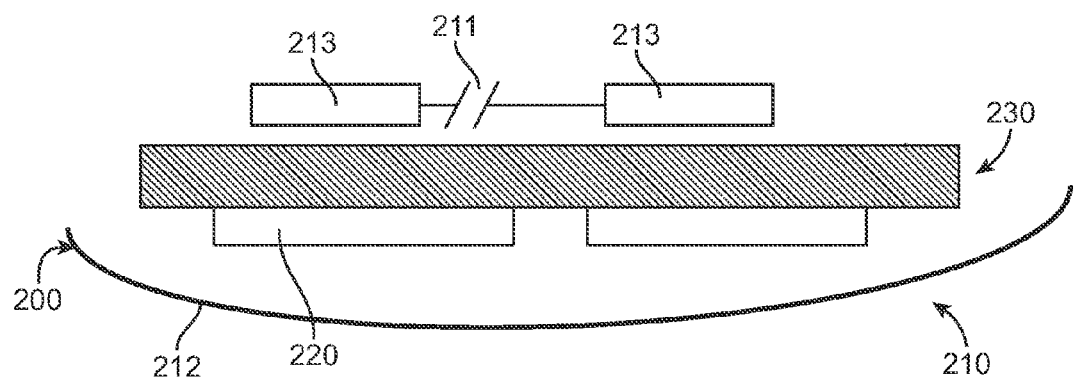
FIG. 2 is a simplified illustrating of a computing device configured in accordance with one or more embodiments.

FIG. 2 is a simplified illustrating of a computing device 200 configured in accordance with one or more embodiments. In FIG. 2, computing device 200 includes a housing 210 having a façade 212 that is structured to position one or more magnetic coils 220. The magnetic coils 220 may transmit or receive inductive signals from another device (e.g. a docking station such as shown with FIG. 1). The magnetic coils 220 operate under a magnetic field that induces currents on the coils 220. The housing 210 retains circuits 211 and electrical components 213 in varying proximity to the coils and the operative magnetic fields for coils 220.

Embodiments described herein recognize that the presence of magnetic fields may induce currents or other undesirable electrical affects in circuits/components other than the coils 220. Such electrical affects can damage the circuits or electrical elements, reduce their lifespan, or interfere with other operations of the device. Accordingly, embodiments provide for use of an inductive shield 230 that protects the circuits 211 and/or components 213 from unwanted magnetic disruptions. In some embodiments, the circuits 211 and components 213 correspond to radio frequency receivers and transmitters, which suffer considerable performance loss in presence of inductively induced noise. Still further, the inductive shield improves efficiency of an inductive energy transfer system.

In some embodiments, the inductive shield 230 is comprised of multiple layers of materials, including insulators (heat or electrical) and/or materials with high magnetic permeability. The individual layers of the inductive shield 230 may also include varying geometries (disc shape, donut shape, rectangular, T-shaped (or 3-leaved), cross-shaped (or 4-leaved) etc.) The individual layers of the inductive shield may also include different three dimensional contours. For example, some embodiments provide for material with high magnetic permeability (Hi MU) that is shaped to extend lengths in three dimensions (X, Y, Z).

Figure 3A:
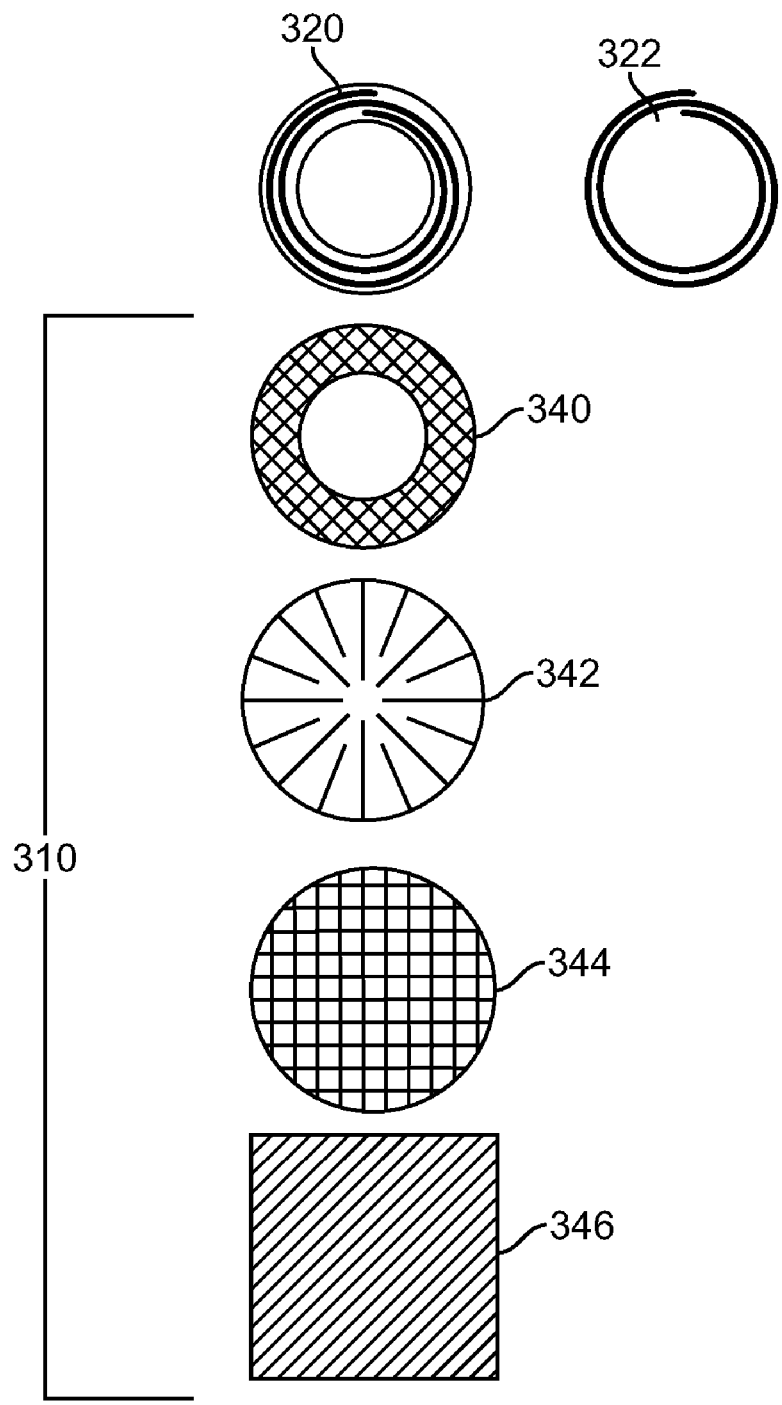
FIG. 3A illustrates one embodiment of an inductive shield, for use with a device that incorporates one or more coils.

FIG. 3A illustrates one embodiment of an inductive shield, for use with a device that incorporates one or more coils 320, 322. In an embodiment, at least some of the individual layers of the inductive shield 310 are disk shaped. In an embodiment, the inductive shield includes (i) an insulating disk 340 (often optional), (ii) Hi MU backing material 342; and (iii) an insulating pad 344. Optionally, an electrically insulating layer 346 may also be provided in the stack as protection against electrical fields (related to magnetic flux). In other embodiments, the inductive shield can include more or fewer layers, and/or different layers of material. As described with numerous embodiments, the inductive shield 310 may be used as a conduit for magnetic flux that can act on magnetic circuits of the device. In some embodiments, the inductive shield may form a portion of a magnetic flux conduit that extends to the other device, so as to carry or distribute magnetic flux. The Hi MU material 342 may have several forms, compositions or structures. In one embodiment, the Hi MU material 342 is highly permeable to magnetic flux, so as to provide a low reluctance flux path. Still further, in some embodiments, the Hi MU material 342 is characterized by low reluctance and high electrical resistivity. These individual layers may be collapsed into one thickness to form the inductive shield 310. Numerous other configurations are possible, including variations to the quantity and type of layers used, and variations to the geometry of the individual layers.

Figure 3B:
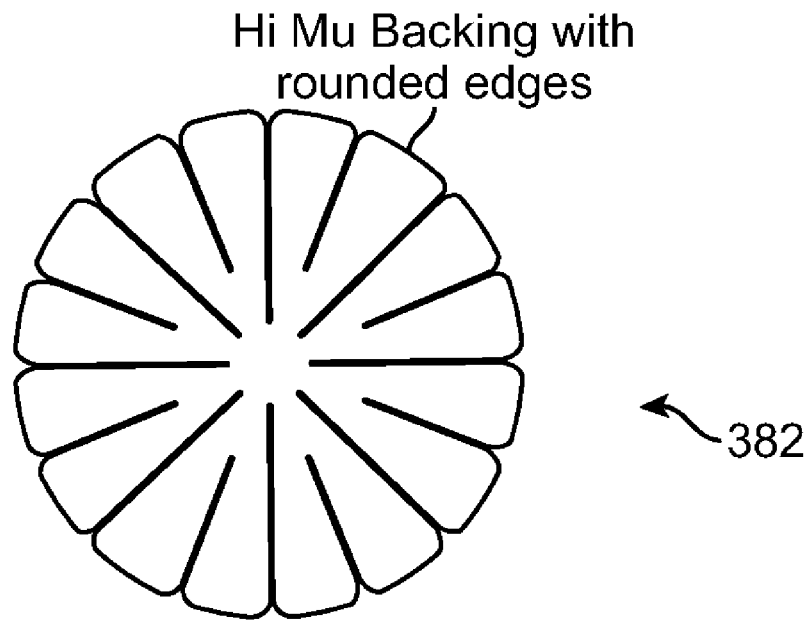
FIG. 3B illustrates a layer of high magnetic permeable material, under an embodiment.

As one variation and with reference to an embodiment of FIG. 3A, FIG. 3B depicts a layer of Hi MU material 382 that includes curved edges and/or cut-slots to minimize induced eddy currents.

Figure 3C:
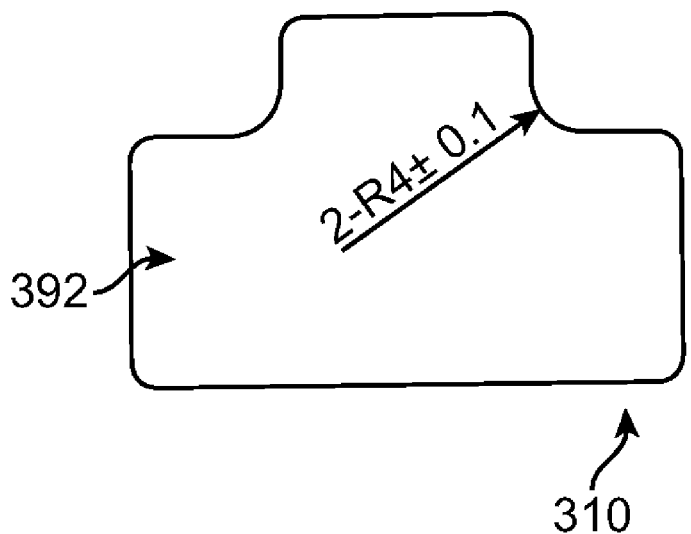
FIG. 3C illustrates another layer of high magnetic permeable material, according to another embodiment.

An another example, with reference to FIG. 3C, one embodiment provides that the inductive shield 310 is substantially provided by a layer of material 392 that has high permeability to magnetic flux, low magnetic reluctance, and high electrical resistivity. An example of such material is Finemet. The use of such materials may eliminate the need for cutting slots or other layers. As described with FIG. 6A and related embodiments, the use of material 392 (e.g. Finemet) may carry different geometric configurations. In the implementation show, for example, the material 392 is three-leaved. In alternative variations, the same material may be placed inside a surface of a computing device housing in two (i.e. bar) or four-leaved (e.g. cross-shaped) forms.

Materials such as depicted in FIG. 3C (and FIG. 3B) allow for a flat and thin layer of protection against inductive coupling noise that is highly effective. In one implementation, one or more layers of Finemet are used that are of an order of less than 100 microns in thickness, and more specifically, less than 40 microns, and still more specifically, of or near 18 microns in thickness. In some embodiments, two or more layers of Finemet (or other suitable material of similar thickness are used).

Figure 4A:
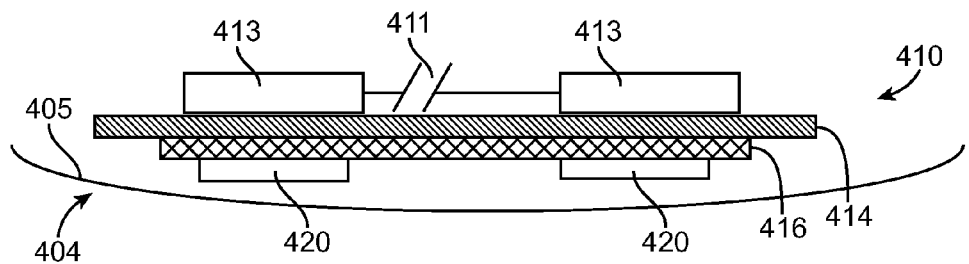
FIG. 4A illustrates an inductive shield positioned on an inside layer of a housing structure, according to another embodiment.

FIG. 4A illustrates an inductive shield positioned on an inside layer of a housing structure, according to another embodiment. In FIG. 4A, the inductive shield 410 may be positioned interior to device housing 404, so as to be adjacent an interior façade 405 of the back façade of the housing. As with an embodiment of FIG. 3A, the inductive shield 410 is positioned to underlie the coils 420, so as to separate or provide spacing between the coils and the electrical circuits/components 411, 413. In an embodiment shown, the inductive shield includes two layers: (i) a Hi Mu layer 414, and (ii) optional insulator 416 disposed vertically between coils 420 and the Hi MU layer 414.

Figure 4B:
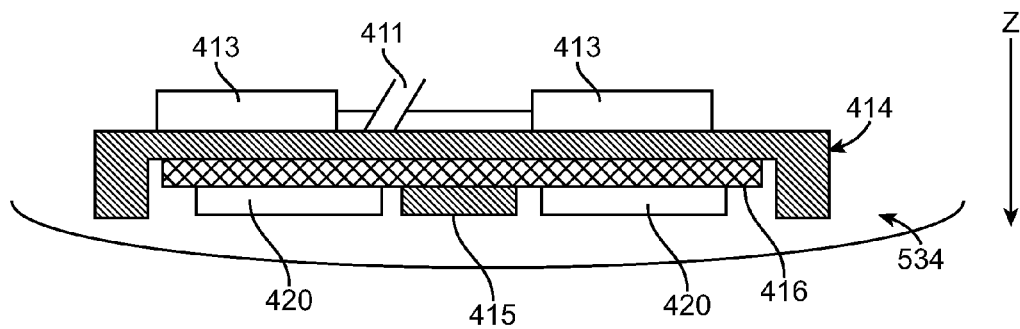
FIG. 4B illustrates a variation to an embodiment of FIG. 4A, in which a hi MU layer is structured to be non-planar or multi-layered.

FIG. 4B illustrates a variation to an embodiment of FIG. 4A, in which the Hi MU layer 414 is structured to be non-planar or multi-layered. More specifically, in an implementation shown, the Hi Mu layer 414 may be shaped to extend (or include extension 415) in the Z-direction (towards the housing surface).

Figure 5:
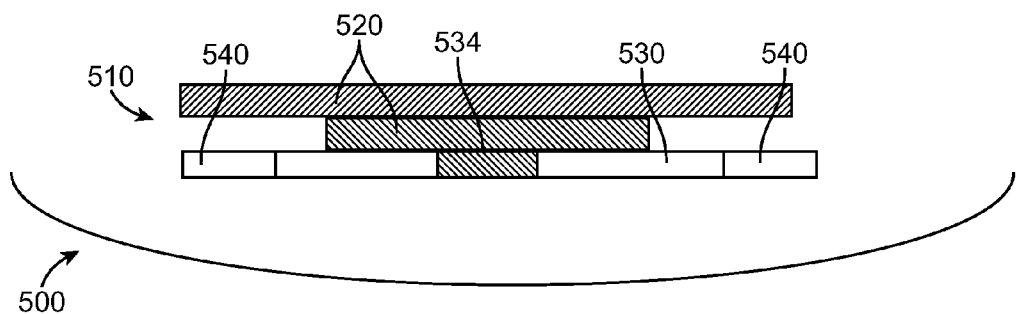
FIG. 5 illustrates still another embodiment for an inductive shield, according to an embodiment.

FIG. 5 illustrates still another embodiment for an inductive shield, according to an embodiment. An inductive shield is positioned on an inside layer of a housing structure, according to another embodiment. More specifically, FIG. 5 depicts a computing device 500 holding an inductive shield 510 that includes a Hi Mu layer 520. In one embodiment, the Hi layer 520 is characterized by the following properties: high in magnetic permeability, low in magnetic reluctance, and high in electrical resistance (so as to not be an electrical conductor). By having high electrical resistance, the material of layer 520 minimize eddy currents when a magnetic field is present. In one embodiment, the material 520 is Finemet, a nanocrystalline material. The implementation shows use of at least one coil 530. In one implementation, a ferrite disk (or similar material) 534 is provided as a center of coil 530. Ferrite tabs 540 are positioned near the surface to enable magnetic clasps on the opposing device to clasp the computing device 500.

Figure 6A:
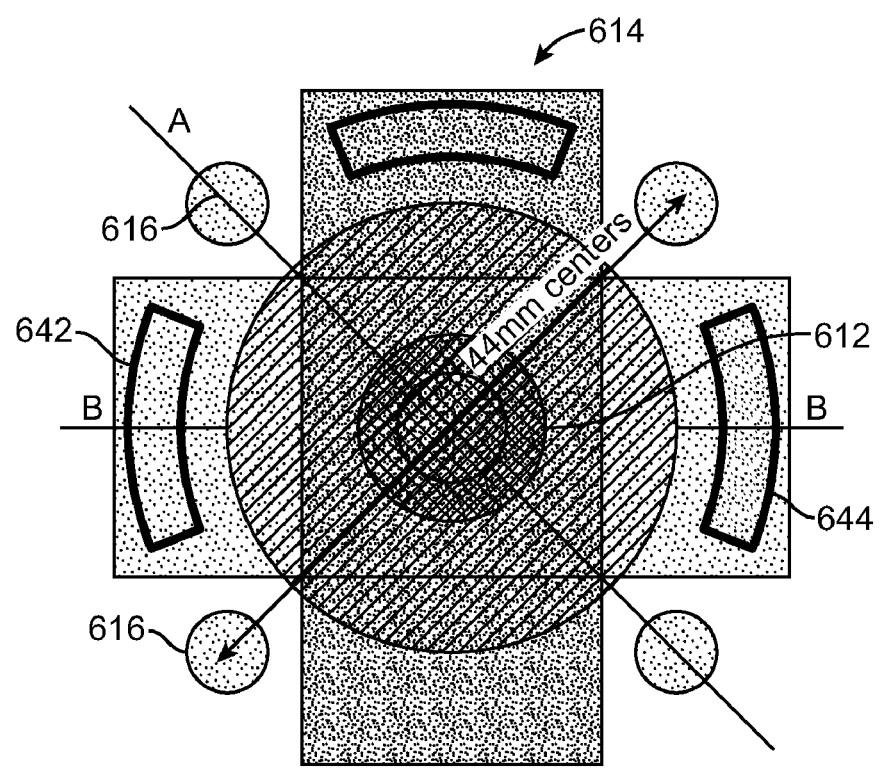
FIG. 6A is a top perspective of a shield for use with an inductive signal transfer system shared by two computing devices, under an embodiment.
Figure 6B:
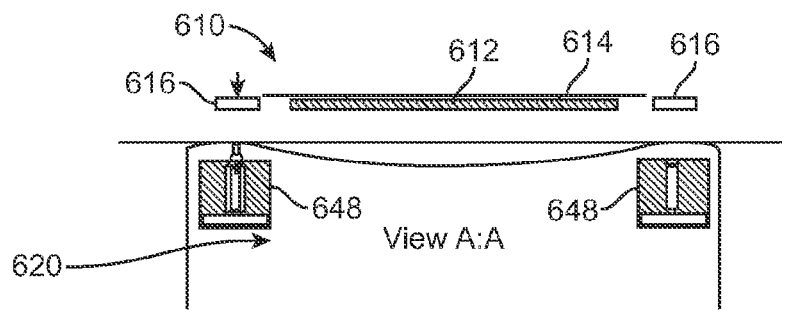
FIG. 6B is a side-cross sectional view of FIG. 6A across line A-A.
Figure 6C:
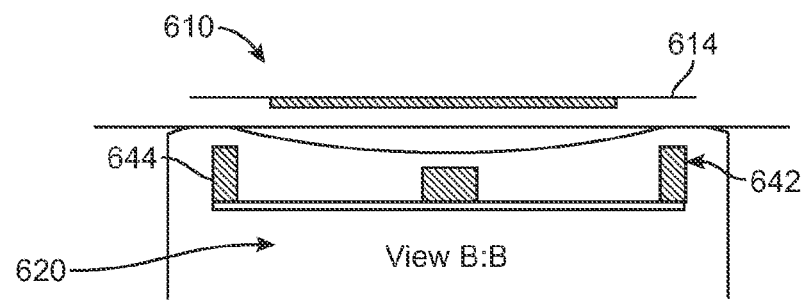
FIG. 6C is a side-cross sectional view of FIG. 6A across line B-B.

FIG. 6A through FIG. 6C illustrate a shield for use with an inductive signal transfer system shared by two computing devices, according to one or more embodiments. In an embodiment, computing device 610 (FIG. 6B) and docking station 620 (FIG. 6B) are coupled to enable inductive signal transfer. As depicted, computing device 610 may include an inductive shield substantially as described with an embodiment of FIG. 5. Accordingly, the computing device 610 includes one or more magnetic coils 612, a Hi MU layer 614, and ferrous tabs 616. The docking station 620 (FIG. 6B and FIG. 6C) includes a ferrite core (distributed as two or more elements 642), and magnets 648 (FIG. 6B) for magnetic coupling of the two devices (separate from inductive signal transfer). With reference to FIG. 6A, the Hi MU layer 614 is four-leaved or cross-shaped and distributed in the computing device. The computing device 610 (FIG. 6B) is structured so that the tabs 616 align with corresponding magnets 648 (FIG. 6B) on the docking station 620 (FIG. 6B). The docking station 620 includes two coils (not shown) (although more or fewer coils can be provided) positioned in between ferrite structures (shown as elements 642, 644).

FIG. 6B is a side-cross sectional view of FIG. 6A across line A-A, showing the tabs 616 aligned with magnets 648. The tabs 616 and magnets 648 enable the two devices to magnetically couple to one another.

FIG. 6C is a side-cross sectional view of FIG. 6A across line B-B, showing the alignment of the ferrite structures 642, 644 on the docking station 620 with respect to the computing device 610. Among other purposes, the ferrite cores enable formation of a magnetic flux conduit. More specifically, the magnetic flux conduit channels magnetic flux used to transmit inductive signals between the device, so as to protect circuits and electrical components on either device from negative electrical effects that would otherwise arise from the inductive signal transfer. As the magnetic field used to transmit an inductive signal must vary, the magnetic flux carried by the conduit may alternate.

Figure 6D:
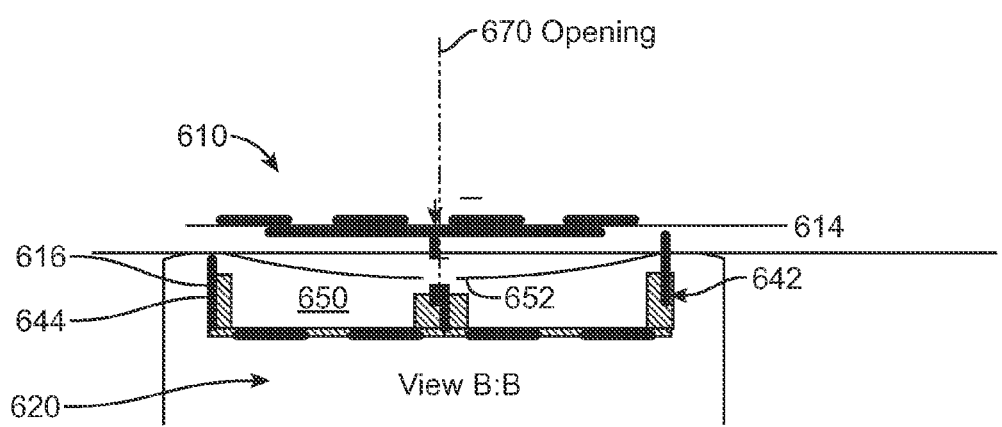
FIG. 6D replicates FIG. 6C, with a representative magnetic flux conduit superimposed as an illustration.

FIG. 6D replicates FIG. 6C, with a representative magnetic flux conduit 650 superimposed as an illustration. As depicted, the magnetic flux conduit 650 is alternating in polarity. As shown, in a given instance: (i) the left portion 650 has a magnetic flux that is counter-clockwise, passing through the center of the Hi MU layer 614 and across the leftward ferrite core 642; (ii) the right portion 652 has a magnetic flux that is clockwise, passing through the center of the Hi MU layer and across the rightward ferrite core 644. At the next instance the magnetic flux may switch polarity, so that the flux passing through the left portion 650 is clockwise, and the flux passing through the right portion 652 is counterclockwise.

With further reference to an embodiment of FIG. 6D, one embodiment provides for formation of an opening 670 provided at or near center of the Hi MU layer 614. The opening 670 may serve the purpose of correcting skew in the magnetic flux when the two devices are not mated perfectly. More specifically, when, for example, computing device 610 is placed slightly off alignment onto the docking station 620, of left portion 650 or right portion 652 of the resulting magnetic flux may become asymmetrical, making the magnetic flux conduit less effective. In such instances, the presence of an opening 670 assists the portions 650, 652 becoming more symmetrical, or more aligned.

As an alternative to forming the opening 670, an alternative variation incorporates a magnet in place of the opening. The use of a magnet in place of the opening 670 similarly serves to center or make more symmetric, the respective portions of the magnetic field 650, 652.

Figure 6E:
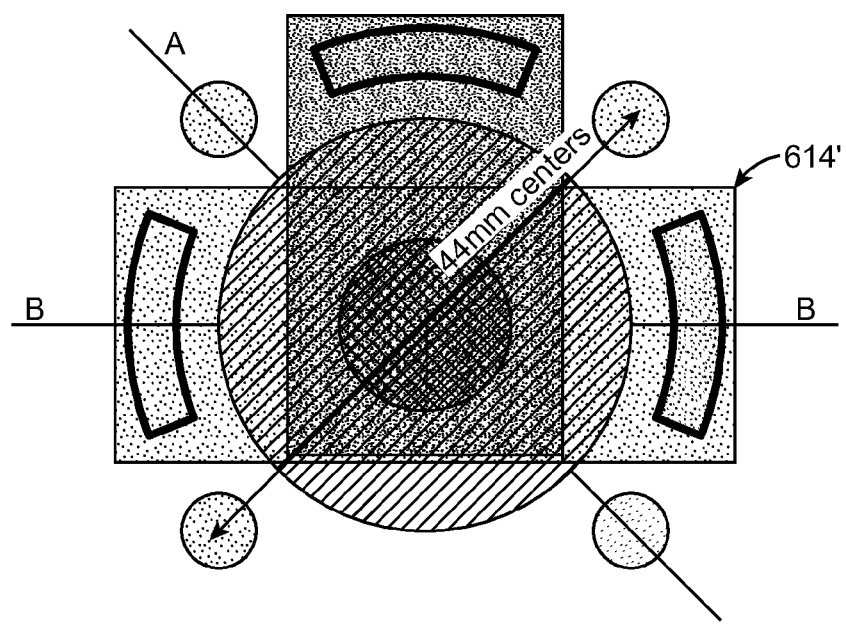
FIG. 6E illustrates an alternative variation in which a three leave Hi MU layer 614' is used in place of the four leaved Hi MU layer.

FIG. 6E illustrates an alternative variation in which a three leave Hi MU layer 614' is used in place of the four leaved Hi MU layer. The three leave formation is effective to form magnetic flux conduits substantially as depicted by FIG. 6D. Moreover, the three leave formation conserves space within the housing of the computing device. As still another variation, a two-leave Hi MU variation may be deployed. Other geometries, such as disk shaped or rounded disks may also be used.

FIG. 7A and FIG. 7B illustrate a variation to other embodiments described herein. In FIG. 7A, a computing device carries an inductive shield 710 comprising a conductive shield 712, residing on an electrical insulator 714 (optional), followed by Hi MU material 716, and another insulator 718. Coils 720, 722 may be provided on an underside (adjacent to the housings surface 723) of the inductive shield 710. In FIG. 7B, a variation is shown in which Hi MU material 716 has a vertical dimension 717 (such as described with an embodiment of FIG. 4B).

Figure 8A:
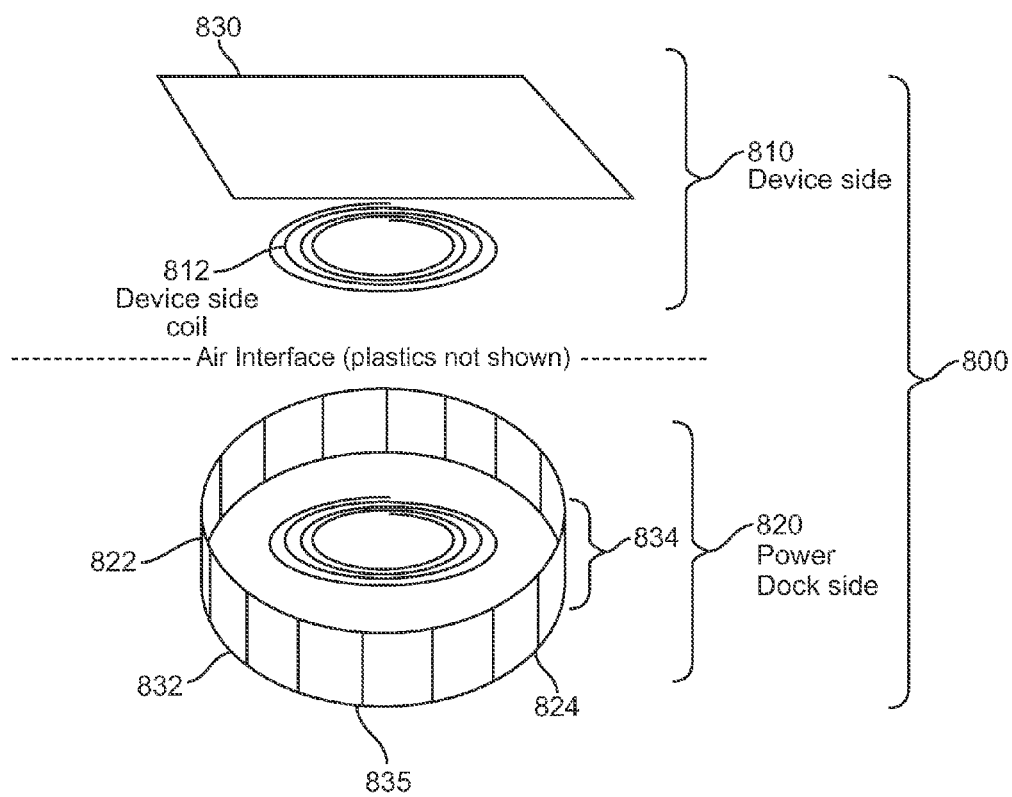
FIG. 8A is a simplified diagram of a computing system in which a dock includes an inductive shield, under another embodiment.
Figure 8B:
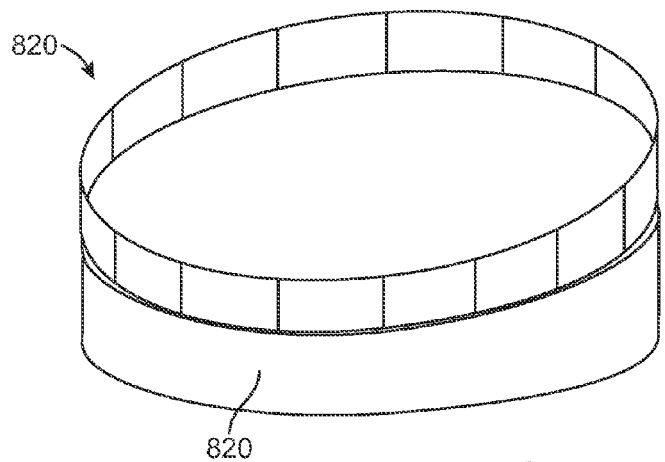
FIG. 8B illustrates a docking station with an inductive shield that protects components in a body of the device.

FIG. 8A is a simplified diagram of a computing system in which a dock includes an inductive shield, under another embodiment. A system 800 includes a computing device 810 and a docking station 820. The docking station 820 includes a receiving surface or platform that can retain a back façade of the housing of the computing device. In order to enable inductive signal transfer, the dock 820 includes magnetic coils 822 that are modulated to create an alternating or varying signal sufficient to induce current on the coil 812 of the computing device 810. In an embodiment depicted, each of the computing device 810 and the dock 820 include inductive shields to protect exterior or surface components (or devices) from electromagnetic interference. In an embodiment, the inductive shield of the dock 820 corresponds to, or comprises a Hi MU material 830, 832 that has low reluctance, and high resistivity, with ability to maintain its electrical/magnetic characteristics without saturation. In an embodiment, the Hi MU material 832 of the dock 820 is shaped to include a vertically-dimensioned segment 834. This segment 834 is shaped to match or correspond to the perimeter walls 824 of the body of the dock. The inductive shield 832 includes platform 835. The combination of platform 835 and segment 834 serve to create an inductive shield. As depicted by FIG. 8B, the inductive shield on the dock 820 may reduce or eliminate electromagnetic interference, such as CLASS B interference defined under Federal Communications Commission.

Figure 9C:
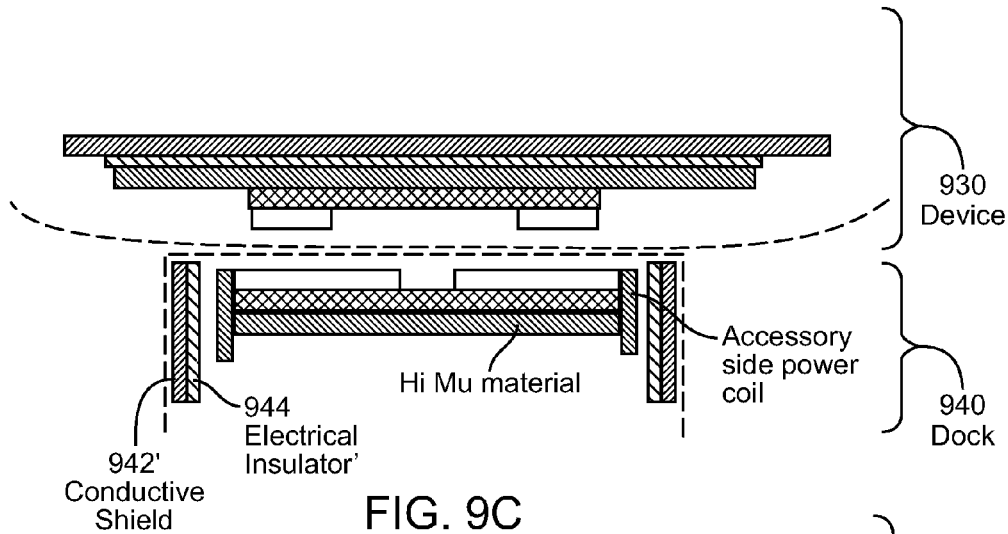
FIG. 9C illustrates a variation to an embodiment of FIG. 9B, in which an electrical shield is provided for a docking station as a vertical element.
Figure 9A:
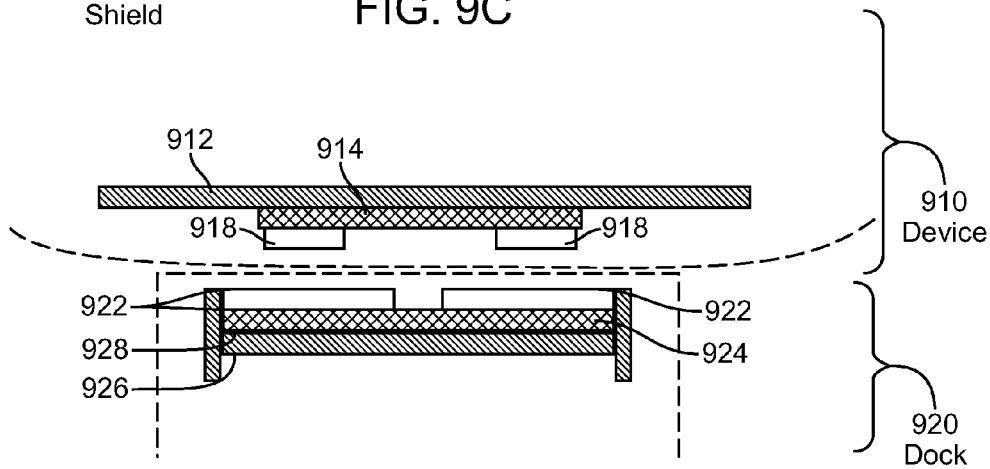
FIG. 9A is simplified illustration of a computing system comprised of a computing device and a dock, under an embodiment.

FIG. 9A is a simplified illustration of a computing system comprised of a computing device and a dock, under an embodiment. In FIG. 9A, computing device 910 includes a Hi MU layer 912, and insulator 914, and one or more coils 918. The dock 920 includes one or more coils 922, an insulator 924, and a corresponding high MU layer 926. As described with an embodiment of FIG. 8A, the high MU layer 926 includes a vertical section 928 for enabling it to act as a conduit of magnetic flux, to shield components that reside under the high MU layer 926. As described with one or more other embodiments, the high MU layer 926 may be formed from Finemet or other comparable materials.

Figure 9B:
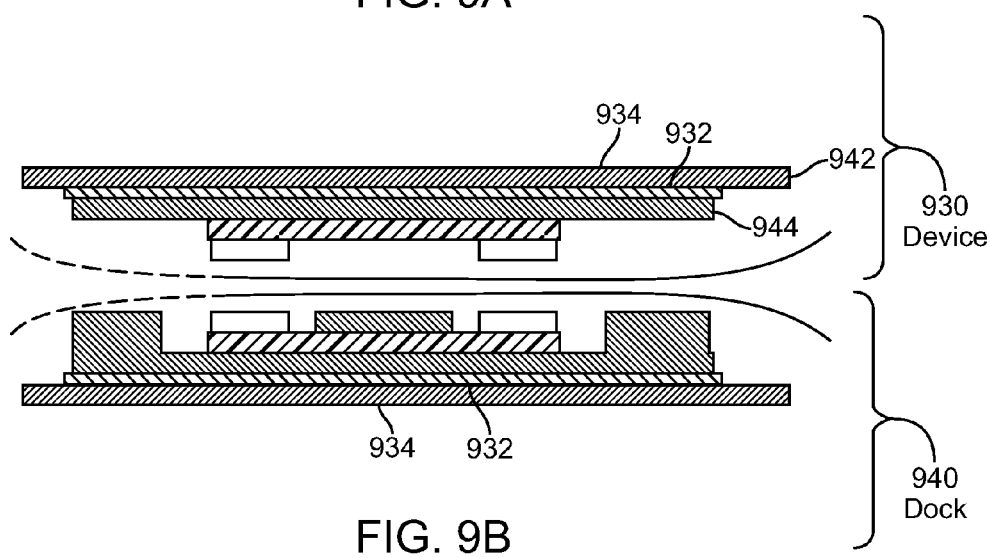
FIG. 9B illustrates a variation to an embodiment of FIG. 9A, under an embodiment.

FIG. 9B illustrates a variation to an embodiment of FIG. 9A, under an embodiment. In FIG. 9B, each of the computing device 930 and the dock 940 (which can be inductively coupled via coils) is provided an electrical shield. More specifically the computing device 930 (which may incorporate the inductive shield described in other embodiments) includes an electrically conductive shield 932, one or more insulator layers 934 and an inductive shield (e.g. high MU layer) as described with other embodiments. Likewise, the dock 940 includes an electrical shield 942 (underlying high MU layer), separated by the insulator 944.

FIG. 9C illustrates a variation to an embodiment of FIG. 9B, in which an electrical shield 942' of the dock 940 is provided as a vertical element.

Figure 10A:
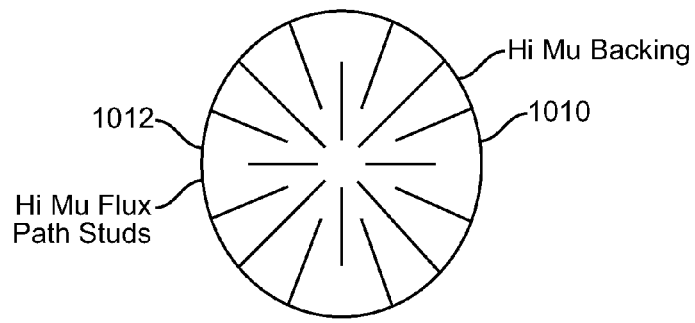
FIG. 10A through FIG. 10C illustrate the use of a core in the backing material, under another embodiment.
Figure 10B:
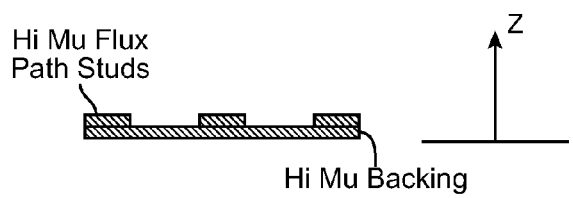
Figure 10C:
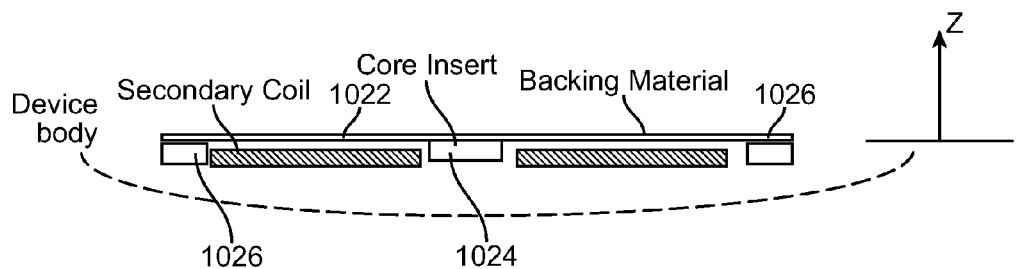

FIG. 10A through FIG. 10C illustrate the use of a core in the backing material, under another embodiment. As described with FIG. 6D, an inductive shield such as described herein may incorporate features for enabling the formation of magnetic flux conduits to carry or shield magnetic flux from a protected region. As still further described with numerous embodiments, a high MU element (such as Finement) may serve as an element of inductive shield and magnetic flux conduit. FIG. 10A and FIG. 10B illustrate an inductive shield (shown in disk shape) in which studs 1012 are positioned on a radial edge, and in center. The studs may correspond to raised elements that are formed or are positioned on the high MU backing layer 1010. The high MU backing layer 1010 carries magnetic flux (when inductive signal transfer occurs). The studs 1012 direct the flux radially outward and in the Z-direction (towards the other computing device), and when the poles alternate, receive the flux (Z-direction) and direct the flux inward and out again via the center stud. FIG. 10C illustrates an alternative configuration, in which the structure of the high MU layer 1022 is positioned on or adjacent to one or more peripheral core elements (e.g. iron) 1026 and further to one center core 1024 to facilitate the conduit for the flux. The flux path then passes through the core elements (and the high MU elements) in alternating fashion.

With regard to embodiments of FIG. 10A through FIG. 10C, the presence of the studs (particularly in center) also provided the added benefit to pull magnetic flux to center symmetry when misalignment occurs. For example, as described with an embodiment of FIG. 6B, when two devices are slightly misaligned when inductively coupled, the misalignment causes the flux to be asymmetrical, further causing power loss and unwanted electrical effects. However, the use of ferrite core, for example, serves as a mechanism by which the magnetic flux can be pulled or centered, even under misalignment conditions.

Exterior Considerations

Embodiments described herein recognize that the presence of metal on an exterior surface of a device may cause unwanted electrical effects when the device is inductively coupled to another device. In the context of, for example, mobile computing devices, it is often desirable from an industrial design perspective to have metal logos or writing on the device. However since metal is conductive it can take power away from the inductive charging circuits.

Figure 11A:
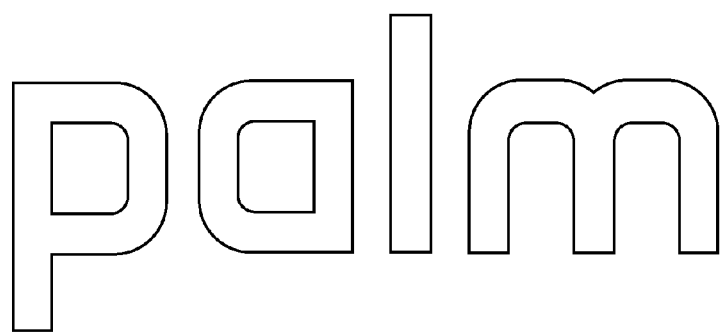
FIG. 11A and FIG. 11B illustrate techniques for removing power loss when metal logos are used on a back surface of a computing device.
Figure 11B:
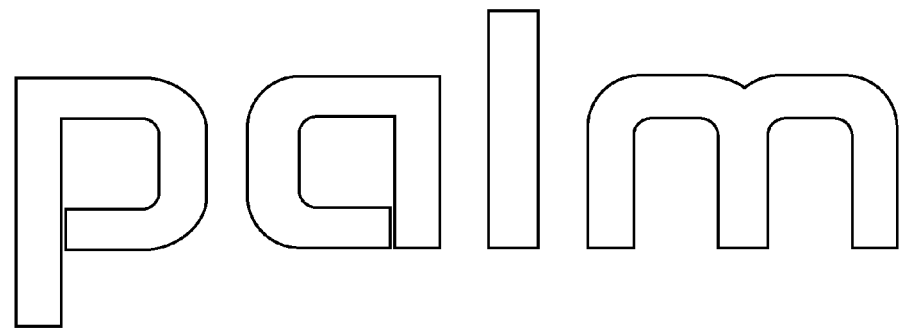

FIG. 11A and FIG. 11B illustrate one strategy for removing power loss when metal logos are used on a back surface of a computing device. FIG. 11A illustrates a typical logo. The presence of looped letters ("P" and "A") take extra power away from a magnetic field. To reduce such effects, FIG. 11B shows that small slots may be cut into the looped letters.

Another technique to overcome power loss from the presence of metal on an exterior surface is (including metal letters and logos) is to form such metal decor using vacuum metallization techniques. Such techniques deposit very thin layers of metal, which diminishes the conductance per length of the metal. In turn, this reduces the amount of loss the metal writing can affect upon a circuit that is to be powered through inductive signal transfer.

Furthermore, with use of non-conductive vacuumized metal (NCVM), the logo can be made to be very attractive while having minimal effects on charging circuits.

Still further, the letters of the logo may be strategically positioned. More specifically, the individual letters or groups of letters may be positioned apart from a magnetic pole of a charging circuits, but rather positioned between the pole to pole pairings. This minimizes the direct flux passage through the letters and hence the amount of induced current.

It is contemplated for embodiments described herein to extend to individual elements and concepts described herein, independently of other concepts, ideas or system, as well as for embodiments to include combinations of elements recited anywhere in this application. Although illustrative embodiments of the invention have been described in detail herein with reference to the accompanying drawings, it is to be understood that the invention is not limited to those precise embodiments. As such, many modifications and variations will be apparent to practitioners skilled in this art. Accordingly, it is intended that the scope of the invention be defined by the following claims and their equivalents. Furthermore, it is contemplated that a particular feature described either individually or as part of an embodiment can be combined with other individually described features, or parts of other embodiments, even if the other features and embodiments make no mentioned of the particular feature. This, the absence of describing combinations should not preclude the inventor from claiming rights to such combinations.

What is claimed is:

1. A computing device comprising:
a housing;
a set of components for enabling receipt of an inductive signal transmitted from another device, the set of components being at least partially contained within the housing; and
an inductive shield positioned near or adjacent to an exterior surface of the housing to shield one or more electrical elements within the housing from a magnetic flux that is provided in connection with the signal transmitted from the other device, wherein the inductive shield is formed to have low magnetic reluctance.

2. The computing device of claim 1, wherein the inductive shield comprises a material with high magnetic permeability.

3. The computing device of claim 1, wherein the inductive shield is also formed to have high electrical resistance.

4. The computing device of claim 1, wherein the inductive shield includes Finemet.

5. The computing device of claim 4, wherein the Finemet has a holed center region.

6. The computing device of claim 4, wherein the Finemet has a magnet in its center region.

7. The computing device of claim 4, wherein the Finemet is shaped to include four leaves about a center region.

8. The computing device of claim 4, wherein the Finemet is shaped to have three leaves and a center region.

9. The computing device of claim 1, wherein the inductive shield comprises a plurality of layers.

10. The computing device of claim 1, wherein the inductive shield comprises material of high magnetic permeability and a center core element.

11. The computing device of claim 10, wherein the inductive shield comprises the material of high magnetic permeability, the center core element, and one or more perimeter core elements.

12. The computing device of claim 10, wherein the material is disk shaped.

13. The computing device of claim 12, wherein the material includes a plurality of radial slits.

14. The computing device of claim 1, wherein the set of components include one or more coils, and wherein the computing device includes a back façade on its housing, to which the inductive shield is positioned adjacent to.

15. The computing device of claim 1, wherein the computing device corresponds to a docking station, and wherein the set of components include one or more coils positioned on a receiving surface of the docking station.

16. The computing device of claim 15, wherein the computing device includes one or more core elements that retain the one or more coils.

17. The computing device of claim 16, wherein the one or more coil elements correspond to a ferrite structure.

18. The computing device of claim 15, wherein the inductive shield includes a vertical section that extends to another device that is to be received and inductively mated on the docking station.

19. The computing device of claim 1, further comprising one or more layers that provide an electric field shield, positioned between the one or more electrical elements that are shielded from the magnetic flux and the inductive shield.

20. The computing device of claim 1, wherein the inductive shield comprises material of high magnetic permeability and a center opening.

21. A computer system comprising:
- a pair of computing devices, each device in the pair including one or more magnetic coils to enable that computing device to transmit or receive an inductive signal from another device in the pair;
- wherein at least one of the computing devices in the pair includes an inductive shield to protect one or more electrical elements of that device from a magnetic flux, the magnetic flux being provided with transmission of an inductive signal from that device, or reception of the inductive signal on that device; and
- wherein the inductive shield is formed to have low magnetic reluctance.

22. The computer system of claim 21, wherein the inductive shield also has high electrical resistance.

23. The computer system of claim 21, wherein the inductive shield is formed from Finemet.

24. The computer system of claim 21, wherein the inductive shield is shaped to have one or more leaves.

* * * * *